United States Patent
Pergande

(10) Patent No.: US 11,415,463 B2
(45) Date of Patent: Aug. 16, 2022

(54) CONTACTLESS WORKPIECE TEMPERATURE SENSOR

(71) Applicant: Applied Materials, Inc., Santa Clara, CA (US)

(72) Inventor: Paul E. Pergande, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 649 days.

(21) Appl. No.: 16/430,649

(22) Filed: Jun. 4, 2019

(65) Prior Publication Data

US 2020/0386621 A1    Dec. 10, 2020

(51) Int. Cl.
| | | |
|---|---|---|
| *G01J 5/00* | (2022.01) |
| *G01K 7/02* | (2021.01) |
| *H01L 21/67* | (2006.01) |
| *G01J 5/10* | (2006.01) |

(52) U.S. Cl.
CPC ............ *G01J 5/0007* (2013.01); *G01J 5/10* (2013.01); *G01K 7/02* (2013.01); *H01L 21/67248* (2013.01)

(58) Field of Classification Search
CPC .. G01J 5/0007; G01J 5/10; G01K 7/02; H01L 21/67248
See application file for complete search history.

(56) References Cited

U.S. PATENT DOCUMENTS

| | | | | |
|---|---|---|---|---|
| 5,516,367 A | * | 5/1996 | Lei ........................ | C23C 16/46 118/728 |
| 5,791,782 A | * | 8/1998 | Wooten .................. | G01K 1/143 374/E1.019 |
| 6,113,702 A | * | 9/2000 | Halpin .............. | H01L 21/68735 118/728 |

(Continued)

FOREIGN PATENT DOCUMENTS

| | | |
|---|---|---|
| EP | 1659429 A1 | 5/2006 |
| KR | 10-2005-0053664 A | 6/2005 |

(Continued)

OTHER PUBLICATIONS

International Search Report and Written Opinion dated Aug. 20, 2020 in corresponding PCT application No. PCT/US2020/032797.

*Primary Examiner* — Nathaniel T Woodward
*Assistant Examiner* — Philip L Cotey
(74) *Attorney, Agent, or Firm* — Nields, Lemack & Frame, LLC

(57) ABSTRACT

A contactless temperature sensor for measuring the temperature of a workpiece is disclosed. The contactless temperature sensor uses a cushion of gas to separate the bottom surface of the workpiece from the top surface of the temperature sensor. The contactless temperature sensor includes a puck having a conduit therethrough. The conduit has a first portion having a first diameter, and a second portion having a second, narrower diameter. A gas tube rests in the first portion of the conduit, disposed proximate the bottom sur- (Continued)

face of the puck. Since the puck is not affixed to the gas tube, angular compliance may be achieved between the workpiece and the puck. Gas passes through the second portion and to the top surface of the puck. This gas provides a cushion between the top surface of the puck and the underside of the workpiece and conducts heat from the workpiece to the puck.

19 Claims, 8 Drawing Sheets

(56) References Cited

U.S. PATENT DOCUMENTS

| | | | | |
|---|---|---|---|---|
| 6,219,219 | B1* | 4/2001 | Hausmann | H01L 21/6831 361/234 |
| 6,332,709 | B1* | 12/2001 | Burke | G01K 1/143 374/E1.019 |
| 2001/0024349 | A1* | 9/2001 | Shamoulian | H02N 13/00 29/843 |
| 2005/0039685 | A1* | 2/2005 | Eiriksson | H01L 21/6838 118/728 |
| 2005/0193952 | A1* | 9/2005 | Goodman | H01L 21/68735 118/728 |
| 2006/0222481 | A1* | 10/2006 | Foree | C30B 25/12 414/800 |
| 2006/0289433 | A1* | 12/2006 | Timans | F27B 17/0025 219/390 |
| 2007/0246192 | A1* | 10/2007 | Cunningham | H01L 21/67109 165/96 |
| 2007/0256786 | A1* | 11/2007 | Zhou | H01J 37/32477 156/345.34 |
| 2017/0076915 | A1* | 3/2017 | Boyd, Jr. | H01J 37/32715 |
| 2022/0005738 | A1* | 1/2022 | Tateno | C23C 16/34 |

FOREIGN PATENT DOCUMENTS

| | | |
|---|---|---|
| TW | 200530647 A | 9/2005 |
| TW | M318185 U | 9/2007 |

* cited by examiner

CONTACTLESS WORKPIECE TEMPERATURE SENSOR

FIELD

Embodiments of the present disclosure relate to a temperature sensor for measuring a workpiece, wherein the temperature sensor does not contact the workpiece.

BACKGROUND

Semiconductor workpieces, such as silicon wafers, are processed to create semiconductor devices. These processes may include implantation, deposition, etching, amorphization, and others.

In certain embodiments, it may be beneficial to perform one or more of these processes at a temperature different than room temperature, such as at elevated or cold temperatures. Ensuring that the workpiece is at the desired temperature often means determining the actual temperature of the workpiece.

Traditionally, this may be done using a temperature sensor, such as an infrared sensor or a contact sensor. However, these sensors have drawbacks. With respect to the infrared sensor, it is known that the emissivity of silicon varies as a function of temperature, making it difficult to accurately measure the temperature of the workpiece. Additionally, silicon is translucent in the infrared spectrum below 400° C., so pyrometers do not function well below 400° C. With respect to contact sensors, often these devices are constructed of thermally conductive materials, such as metallic materials. When these devices contact the workpiece, the metallic material may contaminate the workpiece, or may damage the surface of the workpiece. Simply contacting the surface creates particles, and these particles cause defects on the workpieces.

Therefore, it would beneficial if there were a temperature sensor that accurately measures the temperature of a workpiece without contacting the workpiece. Further, it would be beneficial if the sensor did not rely on infrared wavelengths.

SUMMARY

A contactless temperature sensor for measuring the temperature of a workpiece is disclosed. The contactless temperature sensor uses a cushion of gas to separate the bottom surface of the workpiece from the top surface of the temperature sensor. Further, the temperature sensor is preferably constructed of a material that will not contaminate the workpiece. The contactless temperature sensor includes a puck having a conduit therethrough. The conduit has a first portion having a first diameter, and a second portion having a second, narrower diameter. A gas tube rests in the first portion of the conduit, disposed proximate the bottom surface of the puck. Since the puck is not affixed to the gas tube, angular compliance may be achieved between the workpiece and the puck. Gas passes through the second portion and to the top surface of the puck. This gas provides a cushion between the top surface of the puck and the underside of the workpiece and conducts heat from the workpiece to the puck.

In one embodiment, contactless temperature sensor for measuring a temperature of a workpiece is disclosed. The contactless temperature sensor comprises a puck, comprising: a top surface and a bottom surface; and a conduit passing from the bottom surface to the top surface, wherein the conduit comprises a first portion extending upward from the bottom surface and a second portion extending downward from the top surface, wherein the first portion and the second portion meet at a transition region; a gas tube, disposed in the first portion, wherein the second portion has a minimum diameter such that the gas tube cannot enter the second portion; and a thermocouple affixed to the puck. In certain embodiments, an opening is created in a side of the puck, located between the top surface and the bottom surface, and the thermocouple is disposed in the opening. In certain embodiments, the thermocouple is affixed to the bottom surface of the puck. In certain embodiments, the first portion comprises a hollow cylinder and the second portion comprises a hollow cylinder having a smaller diameter than a diameter of the first portion. In certain embodiments, the first portion comprises a hollow cylinder and the second portion comprises a tapered bore, wherein a diameter at the top surface is larger than a diameter at the transition region. In certain embodiments, the second portion comprises a hollow cylinder and the first portion comprises a tapered bore, wherein a diameter at the bottom surface is larger than a diameter at the transition region. In certain embodiments, the transition region is rounded or chamfered. In some embodiments, an end of the gas tube is rounded so as to allow movement of the puck relative to the gas tube. In some embodiments, the thermocouple is affixed to the puck using a braze material or nanocopper paste.

According to another embodiment, a system for measuring a temperature of a workpiece without contacting the workpiece is disclosed. The system comprises a puck, comprising: a top surface and a bottom surface; and a conduit passing from the bottom surface to the top surface, wherein the conduit comprises a first portion extending upward from the bottom surface and a second portion extending downward from the top surface, wherein the first portion and the second portion meet at a transition region; a gas tube, disposed in the first portion, wherein the second portion has a minimum diameter such that the gas tube cannot enter the second portion; a thermocouple affixed to the puck; and a gas source in communication with the gas tube, wherein gas flows through the gas tube and through the second portion and forms a gas cushion between the top surface of the puck and a bottom surface of the workpiece. In certain embodiments, where the diameter of the gas tube is such that the gas tube is compliant and deforms so as to maintain the gas cushion between the top surface of the puck and the bottom surface of the workpiece. In certain embodiments, the difference between a diameter of the gas tube and the first portion is such that the puck may be misaligned by at least 4 degrees. In some embodiments, the gas tube comprises an offset 90 degree bend to ensure a vertical support portion under the puck. In certain embodiments, the gas flows at a rate of between 0.06 and 5.0 sccm.

According to another embodiment, a system for measuring a temperature of a workpiece without contacting the workpiece is disclosed. The system comprises a puck, comprising: a top surface and a bottom surface; and conduit passing from the bottom surface to the top surface; a gas tube, disposed in the conduit; a thermocouple affixed to the puck; and a gas cushion disposed between the top surface of the puck and a bottom surface of the workpiece. In some embodiments, the gas cushion supports the workpiece such that the workpiece does not contact the puck. In certain embodiments, the gas cushion provides thermal conduction between the workpiece and the puck. In some embodiments, the gas cushion creates a separation between the bottom surface of the workpiece and the top surface of the puck of between 10 μm and 100 μm.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
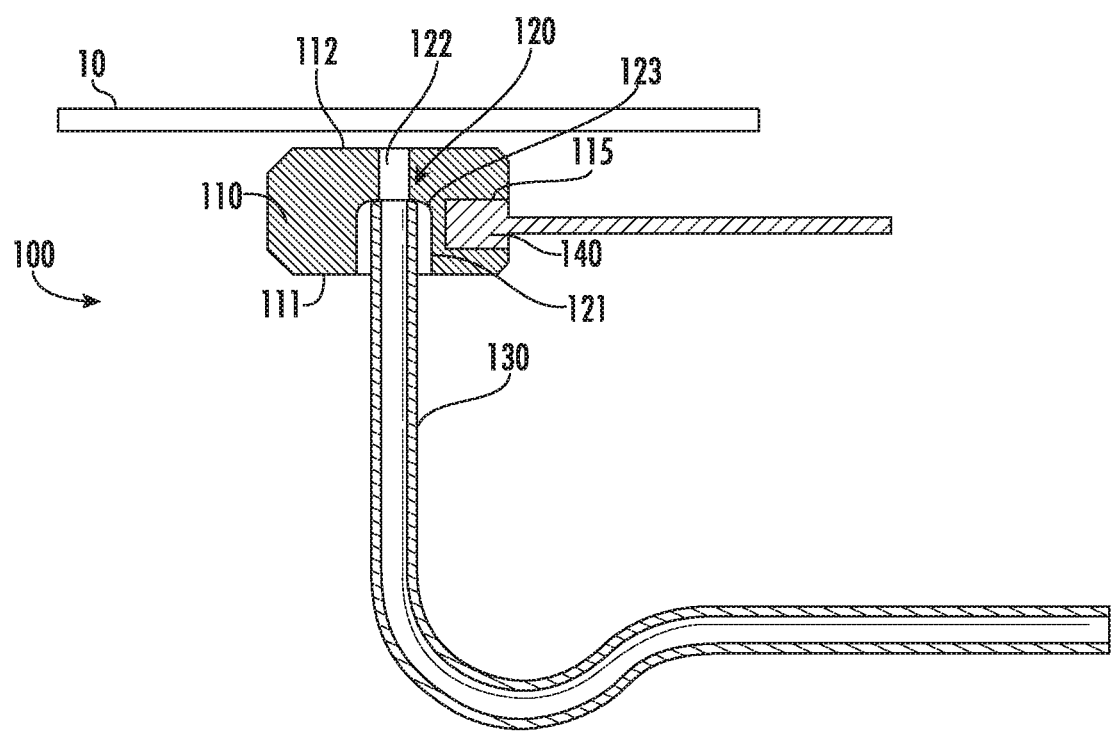
FIG. 1 shows the contactless temperature sensor according to one embodiment.

FIG. 1 shows a cross-section of a contactless temperature sensor 100 according to one embodiment of the present disclosure. The contactless temperature sensor 100 includes a puck 110. The puck 110 may be constructed of a thermally conductive material, such as a metal. For example, nickel-based alloys from the Monel family may be used. In other embodiments, the puck 110 may be constructed of a thermally conductive ceramic material, such as diamond, CVD diamond, sapphire, alumina, silicon carbide, silicon, graphite and beryllium oxide.

The puck 110 may be small enough so that the heat from the workpiece 10 readily heats the puck 110. In certain embodiments, the puck 110 may be a cylinder, having a diameter between 0.12 inches and 0.5 inches and a height between 0.05 inches and 0.35 inches. As shown in FIG. 1, the edges of the puck 110 may be rounded or chamfered. In other embodiments, the puck 110 may be a different shape.

The top surface 112 of the puck 110 is preferably at least as flat as the workpiece 10. The puck 110 has a conduit 120 passing from the bottom surface 111 to the top surface 112. This conduit 120 may be perpendicular to the top surface 112. In certain embodiments, where the puck 110 is cylindrical, this conduit 120 passes through the central axis of the puck 110. The conduit 120 has a first portion 121 extending upward from the bottom surface 111. The conduit 120 also has a second portion 122 extending downward from the top surface 112. The second portion 122 of the conduit 120 has a smaller diameter than the first portion 121. The change in the dimensions of the conduit 120 serves several purposes. First, the first portion 121 is sufficiently large so that the gas tube 130 fits within the first portion 121 and also has enough clearance to allow some amount of angular misalignment. Second, the second portion 122 is smaller than the outer diameter of the gas tube 130, so that the gas tube 130 cannot pass through the second portion 122. In this embodiment, the first portion 121 and the second portion 122 are concentric hollow cylinders, having a first diameter and a second diameter, respectively.

The first portion 121 and the second portion 122 may meet at a transition region 123 near the center of the puck 110. In certain embodiments, the transition region 123 may be rounded or may comprise a chamfer.

A gas tube 130 is inserted into the first portion 121 of the conduit 120. The outer diameter of the gas tube 130 is smaller than the first diameter of the first portion 121. This minimizes the physical contact between the gas tube 130 and the puck 110. Minimizing the physical contact between the gas tube 130 and the puck 110 reduces the thermal path between the puck 110 and the gas tube 130. This thermal 'break' allows for higher accuracy workpiece thermal measurements, by reducing the amount of heat lost to the gas tube 130. Further, the difference in these diameters allows the gas tube 130 to be angularly misaligned with the puck 110. In certain embodiments, the first diameter is selected such that at least 4° of misalignment is allowed with the gas tube 130.

Figure 2:
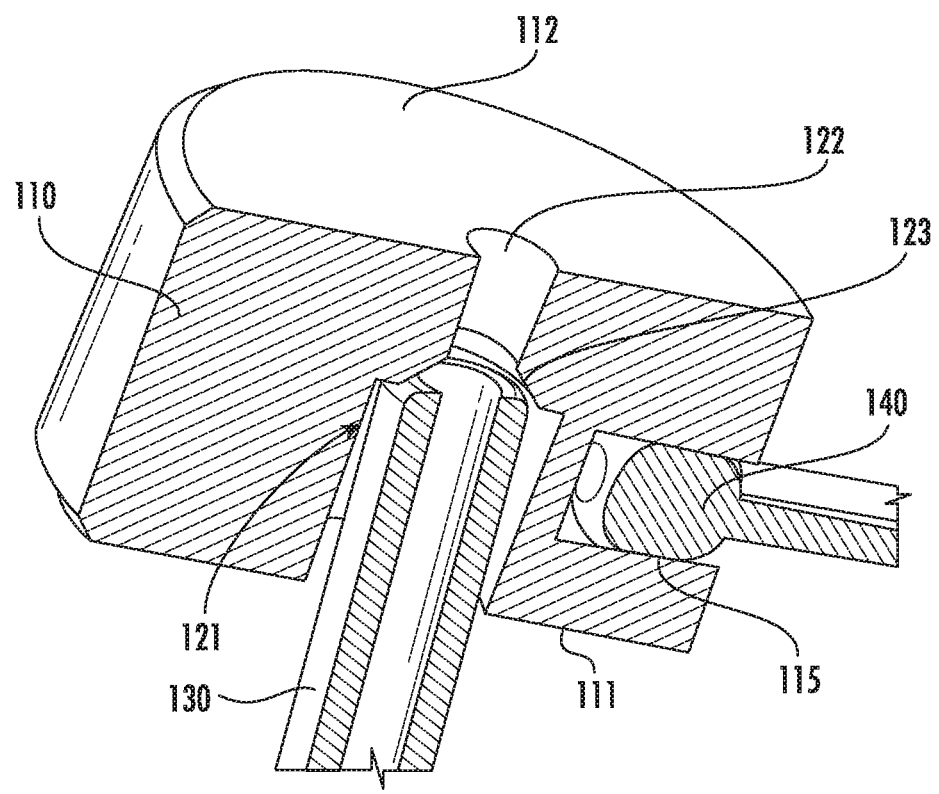
FIG. 2 shows the puck of FIG. 1 angularly misaligned with the gas tube.

The gas tube 130 may be metallic or ceramic. The end of the gas tube 130 may be rounded. This rounded end is in contact with the transition region 123 of the puck 110. This allows easier rotation of the puck 110 about the gas tube 130, as shown in FIG. 2. The outer diameter of the gas tube 130 is large enough to support the weight of the puck 110. Further, the outer diameter of the gas tube 130 may be small enough so as to be compliant, and therefore able to deform to correctly position the puck 110 near the workpiece 10 without contacting the workpiece 10. The outer diameter of the gas tube 130 may range from 0.008 inches to 0.125 inches, although other dimensions may be used. Typical wall thicknesses of the gas tube 130 are between 0.002 inches to 0.015 inches, although other dimensions may be used.

The puck 110 rests on the gas tube 130. As such, the puck 110 is free to move, as there is no bonding or adhesive between the puck 110 and the gas tube 130.

In this embodiment, the puck 110 has an opening 115 in a side. This opening 115 is dimensioned so that a thermocouple 140 can be inserted in the opening 115. For example, the typical size of the opening 115 may be approximately twice the diameter of the welded ball at the end of the thermocouple 140. Common thermocouple ball diameters are between 0.005 inches and 0.010 inches, so an opening 115 having a diameter of about 0.015 inches would accommodate the thermocouple 140, tolerances and the bonding material. The thermocouple 140 may be bonded into the opening 115. The bonding material may be a phase change material that does not reflow at elevated temperatures. For example, in certain embodiments, the bonding material is a braze material or nanocopper pastes, such as those available from Kuprion®.

Figure 3:
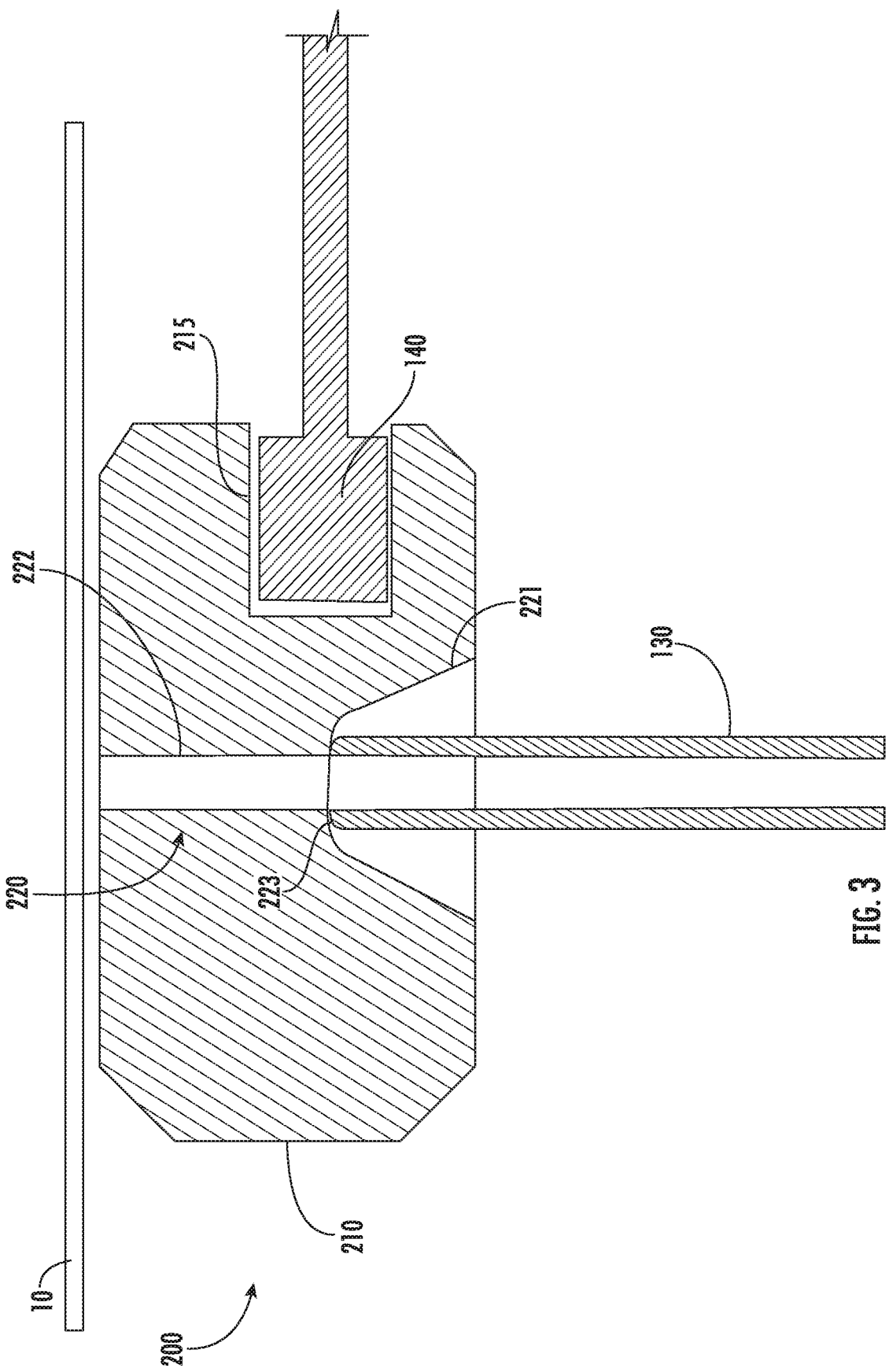
FIG. 3 shows the contactless temperature sensor according to a second embodiment.

FIG. 3 shows a second embodiment of the contactless temperature sensor 200. As with the embodiment of FIG. 1, the puck 210 has an opening 215 on a side, in which the thermocouple 140 is disposed.

In this embodiment, the conduit 220 of the puck 210 has a first portion 221 and a second portion 222. The second portion 222 is similar to the second portion 122 described in FIG. 1 and is a hollow cylinder. The first portion 221 is a tapered bore which meets the second portion 222 at the transition region 223. This tapered bore is shaped so as to have a diameter that is larger at the bottom surface than at the transition region 223. The tapered bore may provide greater thermal resistance between the gas tube 130 and the puck 210 as there may be less physical contact between these two components. The tapered bore also allows greater angular misalignment between the gas tube 130 and the puck 210.

Figure 4:
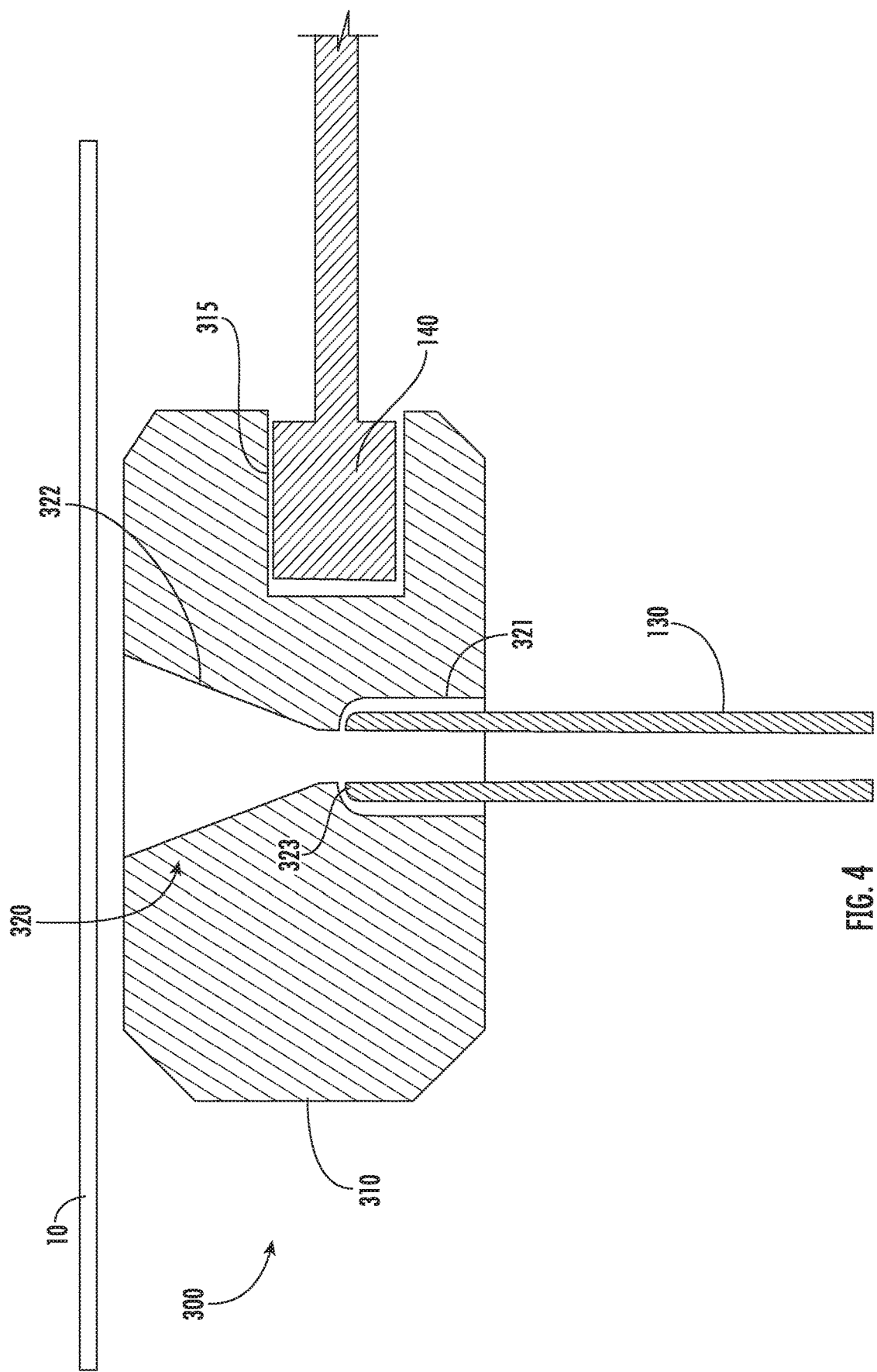
FIG. 4 shows the contactless temperature sensor according to a third embodiment.

FIG. 4 shows a third embodiment of the contactless temperature sensor 300. As with the embodiment of FIG. 1, the puck 310 has an opening 315 on a side, in which the thermocouple 140 is disposed.

In this embodiment, the conduit 320 of the puck 310 has a first portion 321 and a second portion 322. The first portion 321 is similar to the first portion 121 described in FIG. 1 and is a hollow cylinder. The second portion 322 is a tapered bore which meets the first portion 321 at the transition region 323. This tapered bore is shaped so as to have a diameter that is larger at the top surface than at the transition region 323. This tapered bore may provide better gas flow from the gas tube 130 to the underside of the workpiece 10. The minimum diameter of the second portion 322 is such that the gas tube 130 cannot enter the second portion 322.

In yet another embodiment, not shown, the puck may have a first portion and a second portion which are both tapered. In other words, the first portion may be as shown in FIG. 3 and the second portion may be as shown in FIG. 4.

Thus, in each of these embodiments, the conduit is designed such that the gas tube 130 may be inserted into the first portion. Further, the second portion is designed to have a minimum diameter that is smaller than the outer diameter of the gas tube 130 so that the gas tube 130 cannot enter the second portion. Further, there may be a transition region between the first portion and the second portion such that the gas tube 130 may easily move and rotate.

Figure 5:
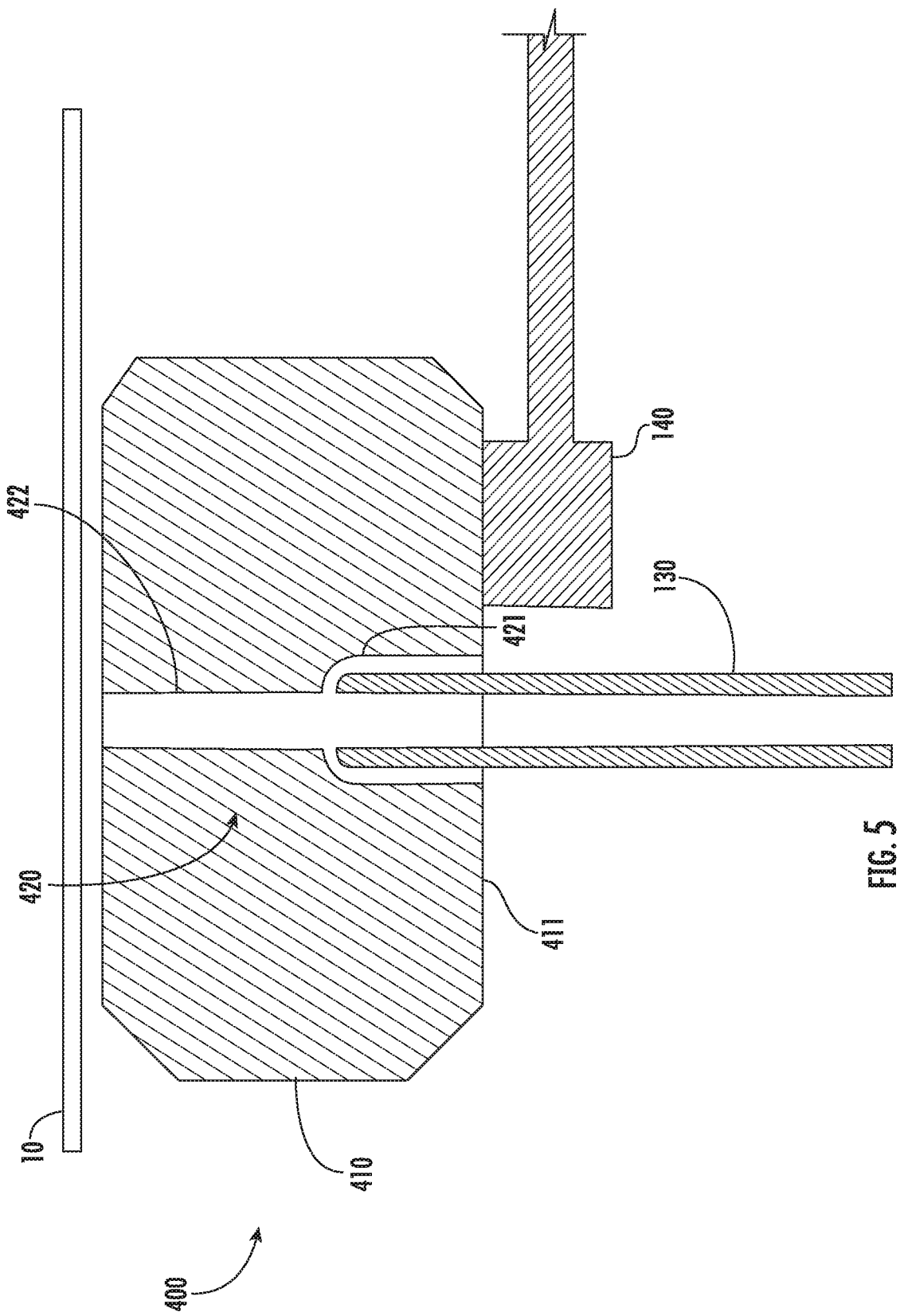
FIG. 5 shows the contactless temperature sensor according to a fourth embodiment.

FIG. 5 shows a fourth embodiment of the contactless temperature sensor 400. In this embodiment, the puck 410 may not have an opening to capture the thermocouple ball. Rather, the thermocouple 140 may be bonded or otherwise attached to the bottom surface 411 of the puck 410. The bonding material may be as described above. The conduit 420 has a first portion 421 and a second portion 422 and may include features described in any of the previous embodiments.

Figure 6:
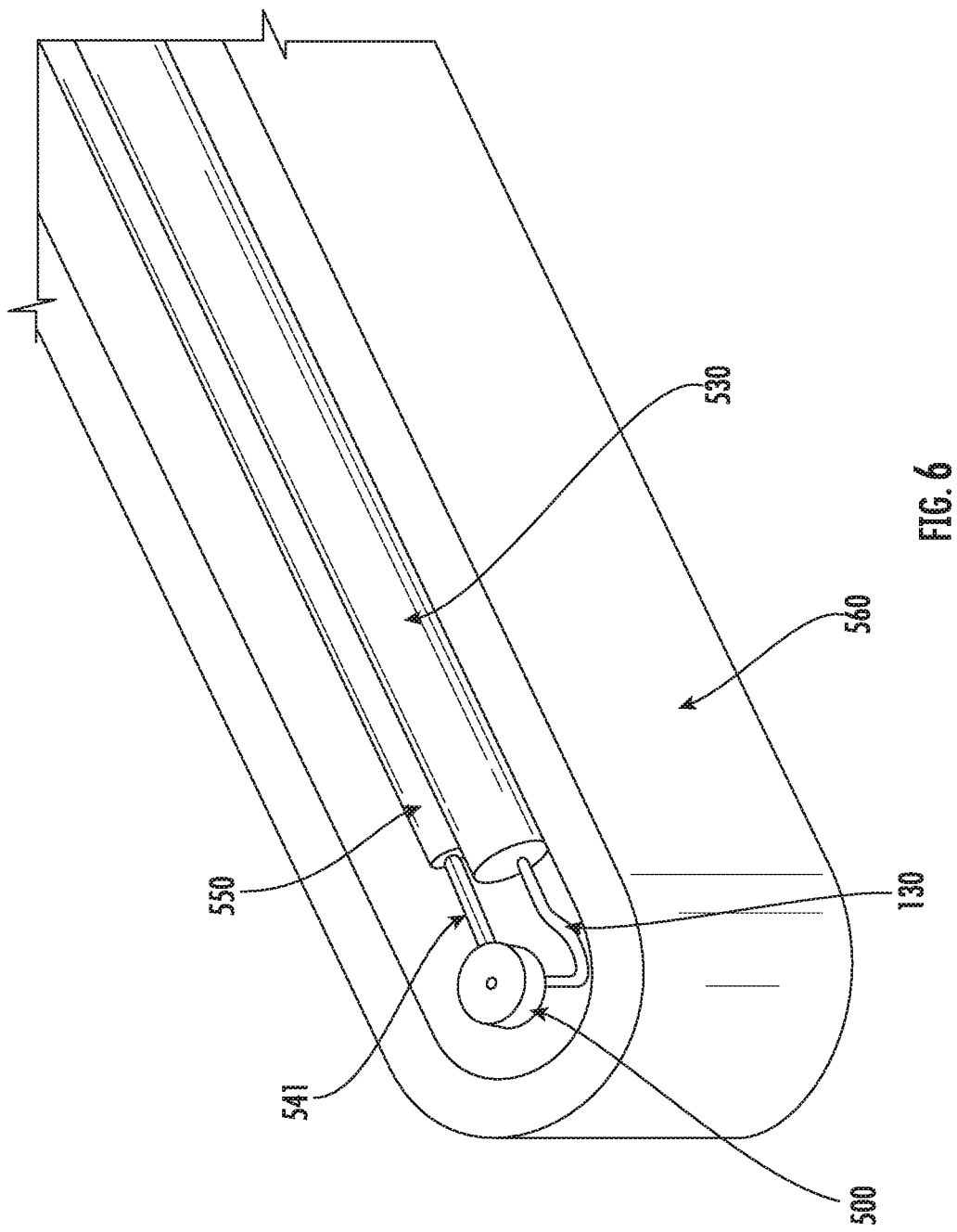
FIG. 6 shows an assembly that may be used to support the contactless temperature sensor of any of these embodiments.

FIG. 6 shows a system that includes the contactless temperature sensor. In this embodiment, the gas tube 130 is encased within a tube support 530. The tube support 530 may be a ceramic material having a central bore through which the gas tube 130 passes. This tube support 530 relieves the gas tube 130 of the stress of supporting the puck 500 along its entire length. In certain embodiments, the exposed portion of the gas tube 130 is not protected by the tube support 530. This allows the gas tube 130 to deform to allow the puck to remain a predetermined distance from the bottom surface of the workpiece 10. The exposed portion of the gas tube 130 may be about 0.250 to 2.0 inches long. In some embodiments, as shown in FIGS. 1 and 6, the exposed portion has an offset 90 degree bend to allow better compliance and ensure a vertical support portion under the puck and a low puck height from the axis of the tube.

The thermocouple 140 has two electrical wires 541 attached thereto. The electrical wires 541 may be housed with a wire support 550. The wire support 550 may be a ceramic tube having two interior channels, where one of the wires 541 passes through each respective channel. There may be an exposed portion of the wires to allow the puck 500 some relative motion with respect to the wire support 550.

In another embodiment, the tube support 530 and the wire support 550 may be the same tube, having at least three interior channels to accommodate the gas tube 130 and the two electrical wires 541.

The entirety of this assembly may be disposed within a mechanical housing 560.

Figure 7:
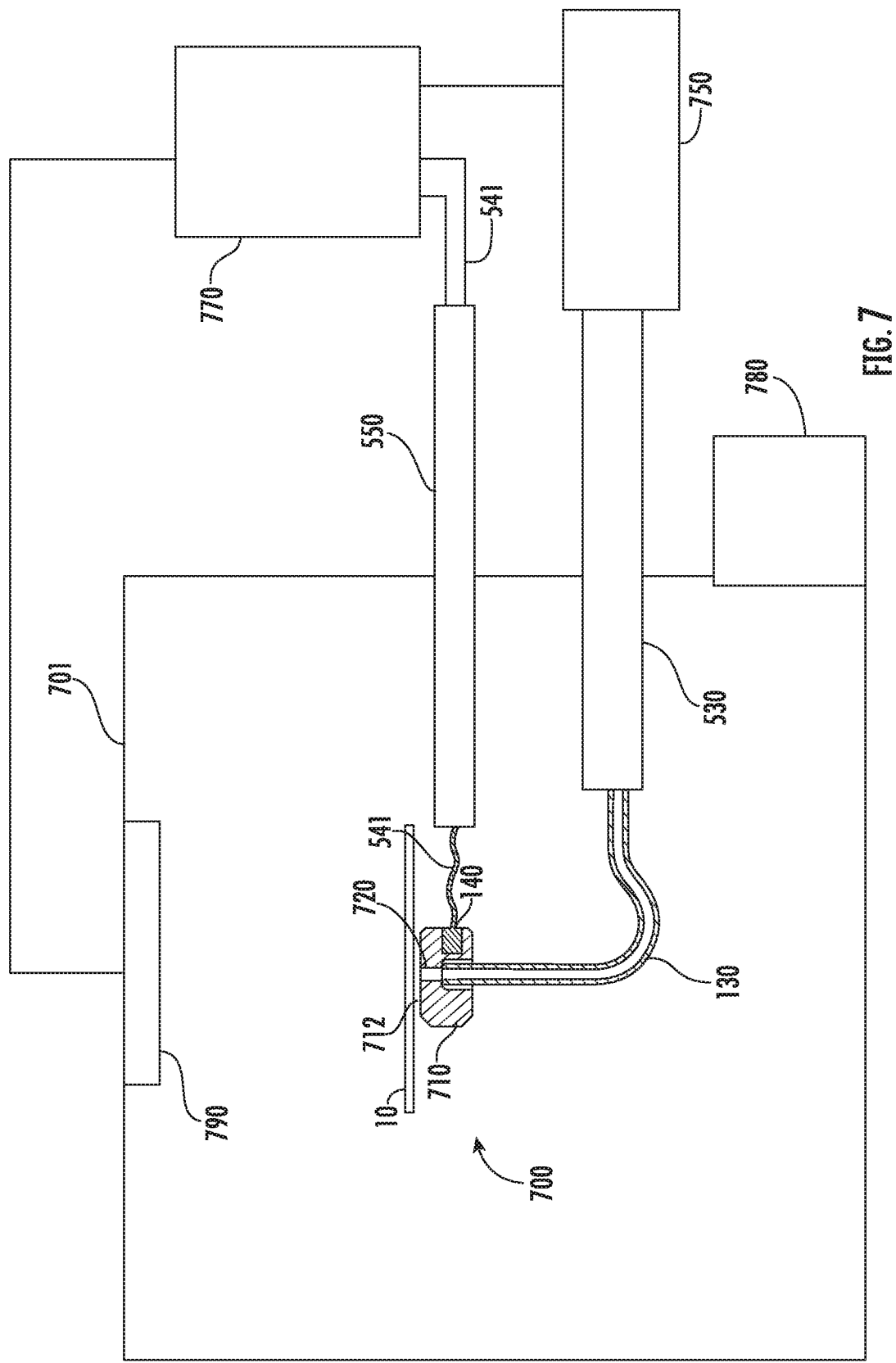
FIG. 7 shows a chamber with a contactless temperature sensor.

The contactless temperature sensor is operated as described below and shown in FIG. 7. The workpiece 10 and the contactless temperature sensor 700 may be disposed within a chamber 701. The chamber 701 may be maintained at a low pressure, such as less than 100 mTorr using vacuum pump 780. The workpiece 10 is supported at three or more points, wherein one of these is the puck 710. The other points may be regular pads, such as polished quartz. As described above, the puck 710 rests on the gas tube 130. The gas tube 130 is covered and protected by the tube support 530 through a portion of its length. A gas source 750 may be disposed outside the chamber 701. The gas source 750 may include a mass flow controller to regulate the flow of gas from the gas source 750. The gas contained within the gas source 750 may be nitrogen or an inert gas, such as helium or argon. Gas from the gas source 750 flows through the gas tube 130 toward the puck 710. This gas exits the gas tube 130 and passes through the second portion of the conduit 720. In some embodiments, the gas flows at a rate of 0.06 to 5.0 sccm, although other rates may be used.

The gas that passes through the second portion of the conduit 720 exits at the top surface 712 of the puck 710. This gas forms a cushion between the bottom surface of the workpiece 10 and the top surface 712 of the puck 710. The gas flows from the center of the top surface 712 and exits at the sides of the top surface 712. This cushion maintains a separation between the puck 710 and the workpiece 10. This separation may be between 10 μm and 100 μm. Further, the gas serves as a thermal conduit between the workpiece 10 and the puck 710. In other words, the heat from the workpiece 10 passes through the gas cushion and reaches the puck 710. This gas conduction warms the puck 710 so that it approaches the temperature of the workpiece 10, without making physical contact with the workpiece 10. Thus, the gas cushion serves two purposes. First, the gas cushion maintains the separation between the workpiece 10 and the puck 710 so that the puck 710 does not contact the workpiece 10. The gas cushion also serves to conduct heat from the workpiece 10 to the puck 710.

Further, as stated above, the puck 710 rests on the gas tube 130. Because of this, the puck 710 is able to rotate independent of the gas tube 130. Thus, the puck 710 is able to move with the workpiece 10 so that the puck 710 remains parallel to the workpiece 10, even as the workpiece expands and warps while being heated. This property is referred to as angular compliance.

A thermocouple 140 is affixed to the puck 710, either at a bottom surface or in an opening on the side of the puck 710. Electrical wires 541 exit the thermocouple 140 and may be protected by a wire support 550. These electrical wires may be in communication with a controller 770. This controller 770 may also be in communication with a heater 790 and the gas source 750. In this way, the controller 770 may perform closed loop control of the temperature of the workpiece 10. In other embodiments, the flow rate of gas may be constant, and the controller 770 is not in communication with the gas source 750. In yet other embodiments, the controller 770 only measures the temperature of the workpiece 10 and is not able to control the heat within the chamber 701. In this embodiment, the controller 770 may not be in electrical communication with the heater 790.

Although not shown, the wire support 550 and the tube support 530 may be disposed within a mechanical housing 560.

Further, because the puck 710 is not affixed to the gas tube 130, the puck 710 is free to move so that it remains parallel to the bottom surface of the workpiece 10. Further, because the gas tube 130 is compliant, the puck 710 does not contact the workpiece 10.

Figure 8:
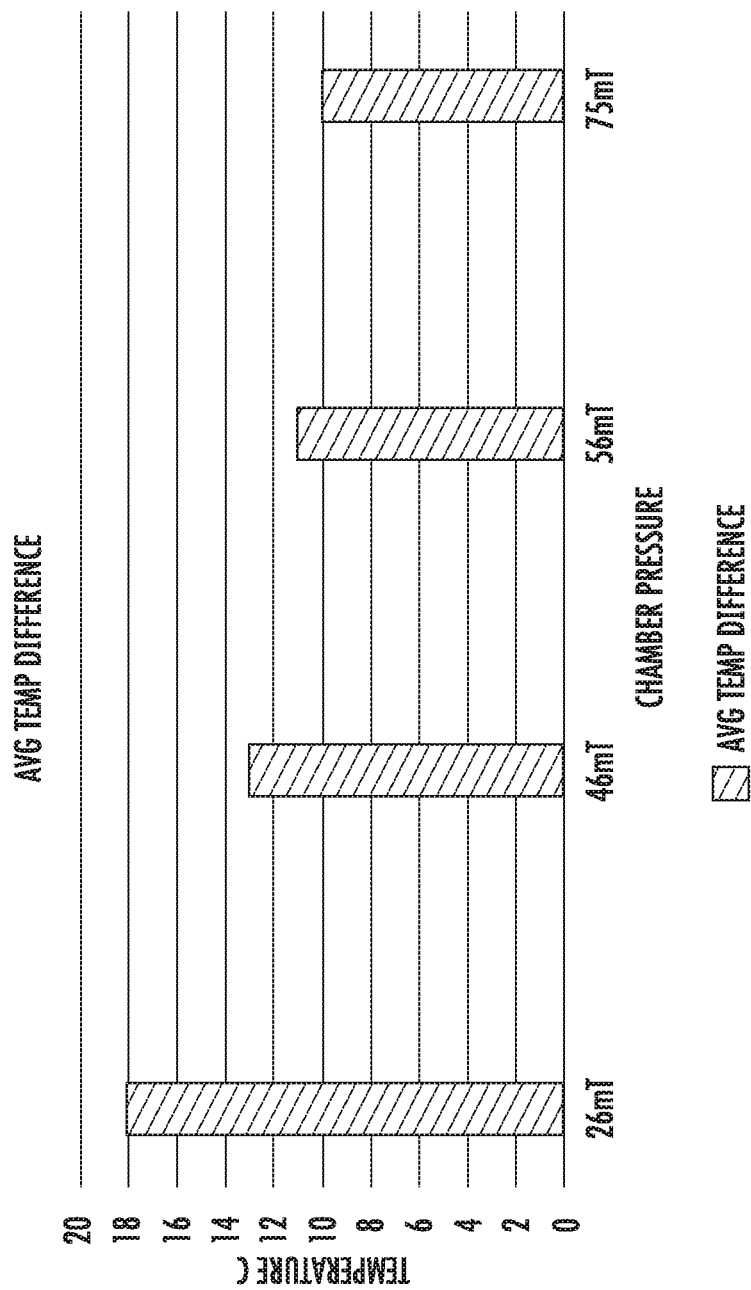
FIG. 8 is a graph showing the correlation between the temperature measured by the contactless temperature sensor and the actual workpiece temperature as a function of chamber pressure.

The temperature of the puck 710 is strongly correlated to the temperature of the workpiece 10. The temperature difference between the puck 710 and the workpiece 10 may be a function of the pressure within the chamber 701. FIG. 8 shows a graph showing the difference between the actual temperature of the workpiece, as measured by thermocouples placed directly on the workpiece, and the temperature as measured by the contactless temperature sensor 700. Note that when the pressure within the chamber 701 is greater than about 30 mTorr, the difference in temperature is less than 15°. This difference decreases as the pressure within the chamber 701 increases due to the increased gas flow through the puck.

The embodiments described in this disclosure may have many advantages. As noted above, this disclosure describes various embodiments of a contactless temperature sensor. This contactless temperature sensor uses a gas cushion to remain separated from the workpiece 10, and to conduct heat to the puck. Because the puck does not contact the workpiece, there is no risk of contamination, as is possible with traditional contact temperature sensors. Further, the puck is non-metallic, further reducing the risk of contamination. Additionally, because the contactless temperature sensor remains very close to the workpiece, it may be able to accurately determine the temperature of the workpiece to within 10° C., as shown in FIG. 8. Finally, this contactless temperature sensor is economical to manufacture and implement.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A contactless temperature sensor for measuring a temperature of a workpiece, comprising:
  a puck, not solely supporting the workpiece, comprising:
    a solid cylinder having a top surface and a bottom surface; and
    a conduit passing from the bottom surface to the top surface located along a central axis of the cylinder, wherein the conduit comprises a first portion extending upward from the bottom surface and a second portion extending downward from the top surface, wherein the first portion and the second portion meet at a transition region;
  a gas tube, disposed in the first portion, wherein the second portion has a minimum diameter such that the gas tube cannot enter the second portion and wherein the gas tube is not affixed to the puck so that the puck may rotate independent of the gas tube; and
  a thermocouple affixed to the puck.

2. The contactless temperature sensor of claim 1, wherein an opening is created in a side of the puck, located between the top surface and the bottom surface, and the thermocouple is disposed in the opening.

3. The contactless temperature sensor of claim 1, wherein the thermocouple is affixed to the bottom surface of the puck.

4. The contactless temperature sensor of claim 1, wherein the first portion comprises a hollow cylinder.

5. The contactless temperature sensor of claim 4, wherein the second portion comprises a hollow cylinder having a smaller diameter than a diameter of the first portion.

6. The contactless temperature sensor of claim 4, wherein the second portion comprises a tapered bore, wherein a diameter at the top surface is larger than a diameter at the transition region.

7. The contactless temperature sensor of claim 1, wherein the second portion comprises a hollow cylinder and the first portion comprises a tapered bore, wherein a diameter at the bottom surface is larger than a diameter at the transition region.

8. The contactless temperature sensor of claim 1, wherein the transition region is rounded or chamfered.

9. The contactless temperature sensor of claim 1, wherein an end of the gas tube is rounded so as to allow movement of the puck relative to the gas tube.

10. The contactless temperature sensor of claim 1, wherein the thermocouple is affixed to the puck using a braze material or nanocopper paste.

11. A system for measuring a temperature of a workpiece without contacting the workpiece, comprising:
  a puck, not solely supporting the workpiece, comprising:
    a top surface and a bottom surface; and
    a conduit passing from the bottom surface to the top surface, wherein the conduit comprises a first portion extending upward from the bottom surface and a second portion extending downward from the top surface, wherein the first portion and the second portion meet at a transition region;
  a gas tube, disposed in the first portion, wherein the second portion has a minimum diameter such that the gas tube cannot enter the second portion and wherein the gas tube is not affixed to the puck so that the puck may rotate independent of the gas tube;
  a thermocouple affixed to the puck; and
  a gas source in communication with the gas tube, wherein gas flows through the gas tube and through the second portion and forms a gas cushion between the top surface of the puck and a bottom surface of the workpiece.

12. The system of claim 11, where a diameter of the gas tube is such that the gas tube is compliant and deforms so as to maintain the gas cushion between the top surface of the puck and the bottom surface of the workpiece.

13. The system of claim 11, wherein a difference between a diameter of the gas tube and the first portion is such that the puck may be misaligned by at least 4 degrees.

14. The system of claim 11, wherein the gas tube comprises an offset 90 degree bend to ensure a vertical support portion under the puck.

15. The system of claim 11, wherein the gas flows at a rate of between 0.06 and 5.0 sccm.

16. A system for measuring a temperature of a workpiece without contacting the workpiece, comprising:
  a puck of a size so as to be readily heated by the workpiece, comprising:

a cylinder having a top surface and a bottom surface, wherein the cylinder has a diameter between 0.12 and 0.5 inches and a height between 0.05 and 0.035 inches; and conduit passing from the bottom surface to the top surface;

a gas tube, disposed in the conduit and not affixed to the puck so that the puck may rotate independent of the gas tube;

a thermocouple affixed to the puck; and a gas cushion disposed between the top surface of the puck and a bottom surface of the workpiece.

17. The system of claim 16, wherein the gas cushion supports the workpiece such that the workpiece does not contact the puck.

18. The system of claim 17, wherein the gas cushion provides thermal conduction between the workpiece and the puck.

19. The system of claim 16, wherein the gas cushion creates a separation between the bottom surface of the workpiece and the top surface of the puck of between 10 μm and 100 μm.

* * * * *